United States Patent

Parekh et al.

[11] Patent Number: 6,165,833
[45] Date of Patent: *Dec. 26, 2000

[54] SEMICONDUCTOR PROCESSING METHOD OF FORMING A CAPACITOR

[75] Inventors: Kunal R. Parekh; Randhir P. S. Thakur, both of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/994,054

[22] Filed: Dec. 19, 1997

[51] Int. Cl.$^7$ .............................................. H01L 21/8242

[52] U.S. Cl. .......................................... 438/240; 438/253

[58] Field of Search ................................... 438/253–256, 438/393–399, 3, 240

[56] References Cited

U.S. PATENT DOCUMENTS

| | | | |
|---|---|---|---|
| 3,571,914 | 3/1971 | Lands et al. | 29/571 |
| 4,464,701 | 8/1984 | Roberts et al. | 361/313 |
| 5,346,844 | 9/1994 | Cho . | |
| 5,352,623 | 10/1994 | Kamiyama . | |
| 5,405,796 | 4/1995 | Jones . | |
| 5,438,012 | 8/1995 | Kamiyama . | |
| 5,442,213 | 8/1995 | Okudaira | 255/854 |
| 5,471,364 | 11/1995 | Summerfelt et al. | 361/321.4 |
| 5,488,011 | 1/1996 | Fiura et al. . | |
| 5,504,041 | 4/1996 | Summerfelt | 437/235 |
| 5,597,756 | 1/1997 | Fazan et al. . | |
| 5,622,883 | 4/1997 | Kim | 438/396 |
| 5,654,222 | 8/1997 | Sandhu et al. | 438/3 |
| 5,663,088 | 9/1997 | Sandhu et al. | 438/396 |
| 5,843,818 | 12/1998 | Joo et al. | 438/240 |
| 5,854,107 | 12/1998 | Park et al. | 428/254 |
| 5,866,453 | 2/1999 | Prall et al. | 438/253 |
| 5,893,980 | 4/1999 | Cho . | |

OTHER PUBLICATIONS

Fazan, P.C., et. al., "A High–C Capacitor (20.4fF/$\mu m^2$) with Ultrathin CVD–$Ta_2O_5$ Films Deposited on Rugged Poly–Si for High Density DRAMs", 1992 IEEE, pp. 263–266.

Lesaicherre, P–Y, et. al., "A Gbit–Scale DRAM Stacked Capacitor Technology with ECR MOCVD $SrTiO_3$ and RIE Patterned $RuO_2$/TiN Storage Nodes", 1994 IEEE, pp. 831–834.

Yamaguchi, H., et. al., "Structural and Electrical Characterization of $SrTiO_3$ Thin Films Prepared by Metal Organic Chemical Vapor Deposition", Jpn. J. Appl. Phys. vol. 32 (1993), Pt. 1, No. 9B, pp. 4069–4073.

Eimori, T., et. al., "A Newly Designed Planar Stacked Capacitor Cell with High dielectric Constant Film for 256Mbit DRAM", 1993 IEEE, pp. 631–634.

Ser. No. 08/542,430, Oct. 12, 1995, Klaus Schuegraf.

(List continued on next page.)

Primary Examiner—Jey Tsai
Attorney, Agent, or Firm—Wells, St. John, Roberts, Gregory & Matkin

[57] ABSTRACT

A semiconductor processing method includes forming a conductively doped plug of semiconductive material within a first insulative layer. A barrier layer to out diffusion of dopant material from the semiconductive material is formed over the doped plug. Examples include undoped oxide, such as silicon dioxide, and $Si_3N_4$. A second insulative layer is formed over the barrier layer. Conductive material is formed through the second insulative layer and into electrical connection with the doped plug. In another implementation, spaced first and second conductively doped regions of semiconductive material are formed. A barrier layer to out diffusion of dopant material from the semiconductive material is formed over at least one of the first and second regions, and preferably over both. Then, a capacitor having a capacitor dielectric layer comprising $Ta_2O_5$ is formed over the other of the first and second regions. Conductive material is formed over and in electrical connection with the one of the first and second regions.

3 Claims, 4 Drawing Sheets

OTHER PUBLICATIONS

Kamiyama, Satoshi, et al., Ultrathin Tantalum Oxide Capacitor Dielectric Layers Fabricated Using Rapid Thermal Nitridation Prior to Low Pressure Chemical Vapor Deposition: *J. Electrochem. Soc.,* vol. 140, #6, pp. 1618–1625 (Jun. 1993).

Yoshimaru, M., et al., "High Quality Ultra Thin $SiO_3N_4$ Film Selectively Deposited on Poly–Si Electrode by LPCVD With In Situ HF Vapor Cleaning", *IEEE,* pp. 271–274 (Apr. 1992).

Kamiyama, S., et al., "Highly Reliable 2.5 nm $Ta_2O_5$ Capacitor Process Technology for 256 Mbit DRAMs", *IEEE,* pp. 827–830 (Sep. 1991).

SEMICONDUCTOR PROCESSING METHOD OF FORMING A CAPACITOR

TECHNICAL FIELD

This invention relates to semiconductor processing methods, including methods of forming capacitors which have $Ta_2O_5$ capacitor dielectric layers.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron, and conventional dielectrics such as $SiO_2$ and $Si_3N_4$ might not be suitable because of low dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness. Chemical vapor deposited (CVD) $Ta_2O_5$ films are considered to be very promising cell dielectric layers for this purpose, as the dielectric constant of $Ta_2O_5$ is approximately three times that of conventional $Si_3N_4$ capacitor dielectric layers. However, one drawback associated with $Ta_2O_5$ dielectric layers is undesired leakage current characteristics. Accordingly, although $Ta_2O_5$ material has inherently higher dielectric properties, as-deposited $Ta_2O_5$ typically produces unacceptable results due to leakage current.

Densification of $Ta_2O_5$ as deposited has been reported to significantly improve the leakage characteristics of such layers to acceptable levels. Prior art densification includes exposing the $Ta_2O_5$ layer to extreme oxidizing conditions. Undesirably, however, such has a tendency to form an $SiO_2$ layer intermediate or between the lower electrode (typically polysilicon) and the $Ta_2O_5$. Further and regardless, a thin $SiO_2$ layer will also typically inherently form during the $Ta_2O_5$ deposition due to the presence of oxygen at the polysilicon layer interface. It is desirable to remove or eliminate this $SiO_2$ layer intermediate the $Ta_2O_5$ and polysilicon layers, yet allow for such desired densification.

One prior art technique includes exposing the polysilicon layer to rapid thermal nitridation just prior to deposition of the $Ta_2O_5$ layer. Such is reported by Kamiyama et al., "Ultrathin Tantalum Oxide Capacitor Dielectric Layers Fabricated Using Rapid Thermal Nitridation prior to Low Pressure Chemical Vapor Deposition", *J. Electrochem. Soc., Vol.* 140, No. 6, June 1993 and Kamiyama et al., "Highly Reliable 2.5 nm $Ta_2O_5$ Capacitor Process Technology for 256 Mbit DRAMs", 830-IEDM 91, pp. 32.2.1–32.2.4. Such rapid thermal nitridation includes exposing the subject polysilicon layer to temperatures of from 800° C. to 1100° C. for sixty seconds in an ammonia atmosphere at atmospheric pressure. The nitride layer acts as a barrier layer to oxidation during $Ta_2O_5$ deposition and subsequent high temperature densification processes to prevent oxidation of the underlying polysilicon electrode. However, such processing can create other problems as explained with reference to FIGS. 1 and 2.

A prior art semiconductor wafer fragment in process is indicated in FIG. 1 with reference numeral 10. Such comprises a bulk monocrystalline silicon substrate 12 having word or gate lines 14, 16, 18 and 20 formed thereover. Exemplary diffusion regions 15 and 17 constituting a transistor source or drain are provided as shown. An area or region 22 of wafer fragment 10 comprises a memory array area while a region or area 24 constitutes some area typically peripheral to the memory array. A first insulative layer 26, for example borophosphosilicate (BPSG) glass, is formed over and about gate lines 14–20. Exemplary conductive plugs 28 and 30 extend upwardly from diffusion regions 15 and 17 within substrate 12 between the illustrated gate lines within insulating material layer 26 to the upper surface of insulating layer 26. Such plugs are heavily doped with 1 phosphorus to a concentration of, for example, greater than or equal to $1\times10^{21}$ atoms/cm$^3$ to achieve acceptable conductivity.

A second insulative layer 32, again typically BPSG, is formed over first insulative layer 26 and polysilicon plugs 28 and 30. An opening 34 for a capacitor is etched within layer 32 over polysilicon plug 28 within array region 22. A lower or inner capacitor electrode 36 is formed within opening 34. Such again preferably comprises heavily phosphorus doped polysilicon, such as hemispherical grain polysilicon. Nitridation would then occur to form a very thin (i.e., less than 50 Angstroms) layer of $Si_3N_4$ (not shown).

Unfortunately, the high nitridizing temperature has the effect of out diffusing phosphorus from polysilicon into layer 32 where polysilicon plugs formed elsewhere on the wafer are not covered with lower capacitor electrode material, such as plug 30. Such is shown by outline 40 in region 24. Although layer 32 in the typical prior art example does include phosphorus doping, the phosphorus concentration within the polysilicon plugs is considerably greater, leading to the out diffusion and localized greater concentration of phosphorus within layer 32. Out diffusion of this nature is not problematic where the polysilicon plugs underlie capacitor electrode material, as both layers in such instance typically constitute polysilicon which is heavily doped with phosphorus.

Referring to FIG. 2, a $Ta_2O_5$ layer 42 is formed over the substrate and subsequently etched or planarized back to form said dielectric layer over the lower or inner capacitor electrode 36. As above, such layer is then subjected to oxidation conditions which densify said layer to form a desired capacitor dielectric layer. Unfortunately, the higher doped phosphorus region 40 within the BPSG layer immediately proximate the polysilicon plugs results in an air bubble or void 44 forming within BPSG layer 32. This also has a tendency to inherently lift layer 32 upwardly and off of the plug. Such is highly undesirable. The formation of this bubble/void is also a function of the stress in the BPSG as well as the geometry of the underlying encapsulated gate line or other features, but is aggravated by the high temperature processing associated with the nitridation and $Ta_2O_5$ densification steps.

It would be desirable to improve upon such prior art processes, enabling utilization of $Ta_2O_5$ layers in capacitor constructions. Although the invention was motivated from this perspective, the artisan will appreciate applicability in other areas of semiconductor processing with the invention only being limited by the accompanying claims appropriately interpreted in accordance with the Doctrine Of Equivalents.

SUMMARY OF INVENTION

In accordance with one aspect of the invention, a semiconductor processing method includes forming a conductively doped plug of semiconductive material within a first insulative layer. A barrier layer to out diffusion of dopant material from the semiconductive material is formed over the doped plug. Examples include undoped oxide, such as silicon dioxide, and $Si_3N_4$. A second insulative layer is formed over the barrier layer. Conductive material is formed through the second insulative layer and into electrical connection with the doped plug.

In another implementation, spaced first and second conductively doped regions of semiconductive material are formed. A barrier layer to out diffusion of dopant material from the semiconductive material is formed over at least one of the first and second regions, and preferably over both. Then, a capacitor having a capacitor dielectric layer comprising $Ta_2O_5$ is formed over the other of the first and second regions. Conductive material is formed over and in electrical connection with the one of the first and second regions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
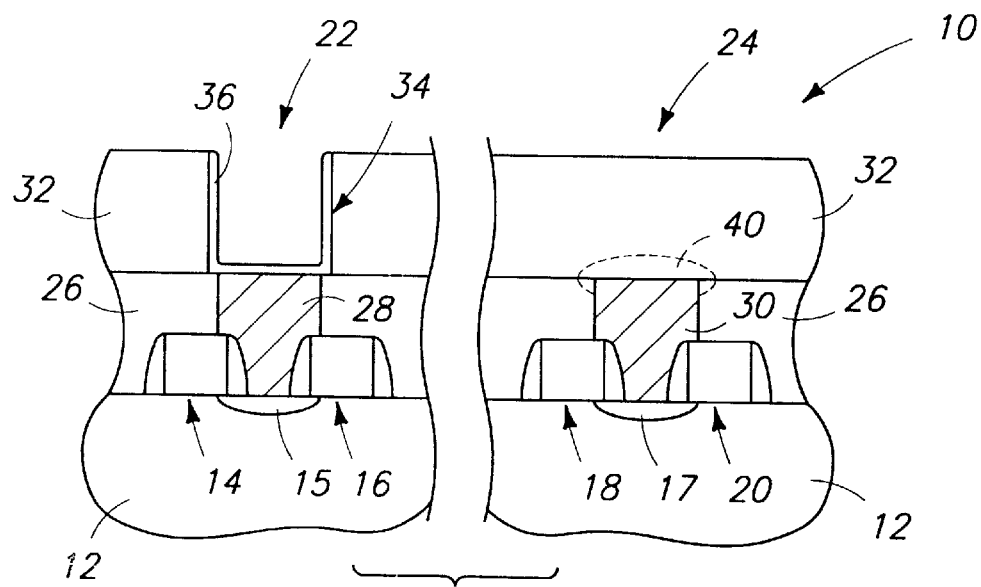
FIG. 1 is a diagrammatic view of a prior art semiconductor wafer fragment at a prior art processing step, and is desired above in the "Background" section.
Figure 2:
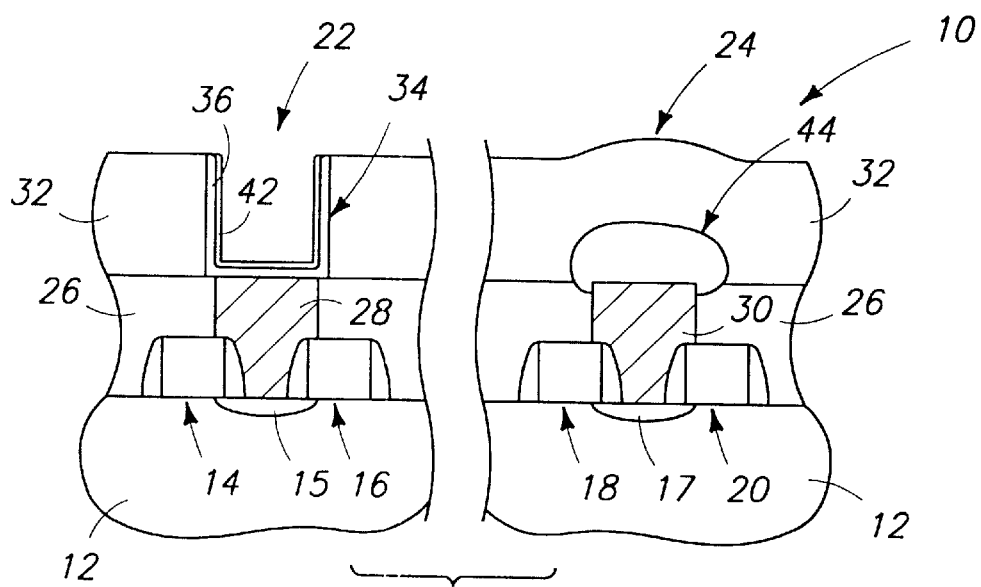
FIG. 2 is a view of the FIG. 1 wafer fragment at a prior art processing step subsequent to that depicted by FIG. 1.

An exemplary and preferred embodiment of the invention is described with reference to the FIGS. 3–7 which show a somewhat analogous construction to that depicted by FIGS. 1 and 2 of the prior art above. Like numerals from this construction have been utilized where appropriate, with differences being indicated with the suffix "a" or with different numerals.

Figure 3:
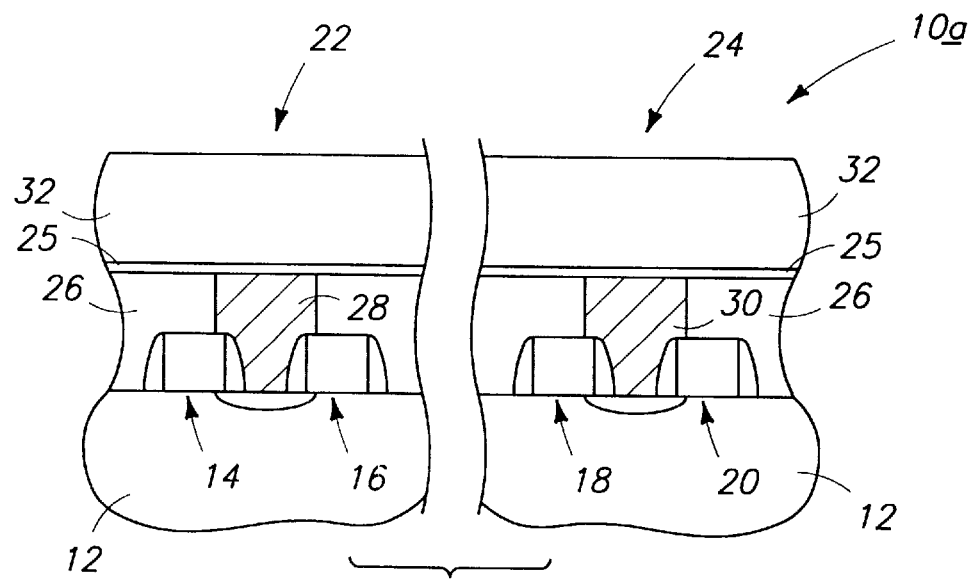
FIG. 3 is a diagrammatic sectional view of a semiconductor wafer fragment at one step in a process in accordance with the invention.

Referring initially to FIG. 3, spaced first and second conductively doped plugs 28 and 30 of semiconductive material are formed within first insulative layer 26 of substrate 10a. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Plugs 28 and 30 preferably comprise polysilicon conductively doped with phosphorus to an exemplary concentration of $1\times10^{21}$ atoms/cm$^3$. Alternately considered, the first and second conductively doped plugs constitute spaced first and second conductively doped regions of semiconductive material. By way of example only, such conductively doped regions could comprise diffusion regions formed in a bulk semiconductor substrate or thin film semiconductive layer. First insulative material 26 preferably comprises doped oxide, such as phosphorus doped oxide including BPSG.

A barrier layer 25 to out diffusion of dopant material from the semiconductive material is formed over at least one of first and second regions 28 and 30, and in the preferred embodiment is formed over both such regions. In the context of this embodiment, such ideally comprises an insulative material, with undoped oxide and $Si_3N_4$ being examples. An exemplary thickness for barrier layer 25 is from about 100 Angstroms to about 500 Angstroms. The preferred material is undoped silicon dioxide deposited by decomposition of tetraethylorthosilicate (TEOS), and deposited to a thickness of from about 300 Angstroms to about 500 Angstroms. Where layer 25 is $Si_3N_4$, an exemplary thickness is from about 100 Angstroms to about 300 Angstroms. A second insulative layer 32 is formed over barrier layer 25, and preferably constitutes the same material as first insulative layer 26. Regardless, exemplary materials for layer 32 comprise doped oxide such as phosphorus doped oxide including BPSG. Another example includes boron and/or phosphorus-doped oxide deposited utilizing TEOS as a chemical vapor deposition precursor. Layer 32 can be subjected to a suitable reflow anneal.

Figure 4:
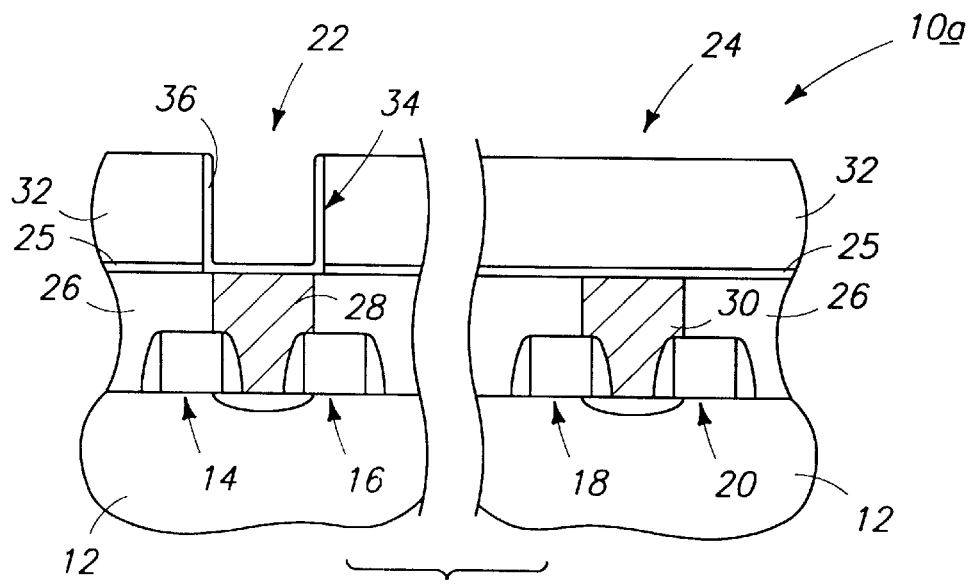
FIG. 4 is a view of the FIG. 3 wafer fragment at a processing step subsequent to that depicted by FIG. 3.

Referring to FIG. 4, an opening 34 is formed within second insulating layer 32 over plug 28, and through barrier layer 25. Inner capacitor electrode 36 is formed within opening 34 over and in electrical connection with first doped plug 28 while leaving insulative material of insulative barrier layer 25 over second doped plug 30. Thus, such provides but one example of forming conductive material through second insulative layer 32 and into electrical connection with doped plug 28, with in this example such conductive material also being formed through barrier layer 25. An exemplary process for formation of electrode 36 is to form hemispherical grain polysilicon over layer 32 and within opening 34, followed by forming photoresist over the substrate, and followed by either photoresist etchback or chemical-mechanical polish to isolate conductive polysilicon within opening 34. Further, a subsequent recess etch of material of layer 36 can be conducted to lower the uppermost surface of the illustrated container electrode to slightly beneath the upper surface of layer 32 (not shown). Photoresist would then be stripped to leave the construction shown in FIG. 4.

Such provides but one example of forming an inner capacitor electrode within opening 34 over and in electrical connection with first doped plug 28, while leaving insulative material of insulative barrier layer 25 and insulative material of layer 32 over second doped plug 30. Then, typically at a temperature of at least 900° C. and in the presence of a nitrogen-containing gas such as $NH_3$, the wafer is nitridized to form a silicon nitride layer (not shown) over the outer surface of electrode 36 while leaving insulative material of doped oxide insulative layer 32 and insulative material of insulative barrier layer 25 over second doped plug 30. Such provides but one example of formation of an oxidation barrier layer over inner capacitor electrode plate 36. Layer 25, during such nitridation, ideally restricts out diffusion of dopant material from second doped plug 30 from occurring into doped insulative oxide layer 32 during such high temperature processing.

Figure 5:
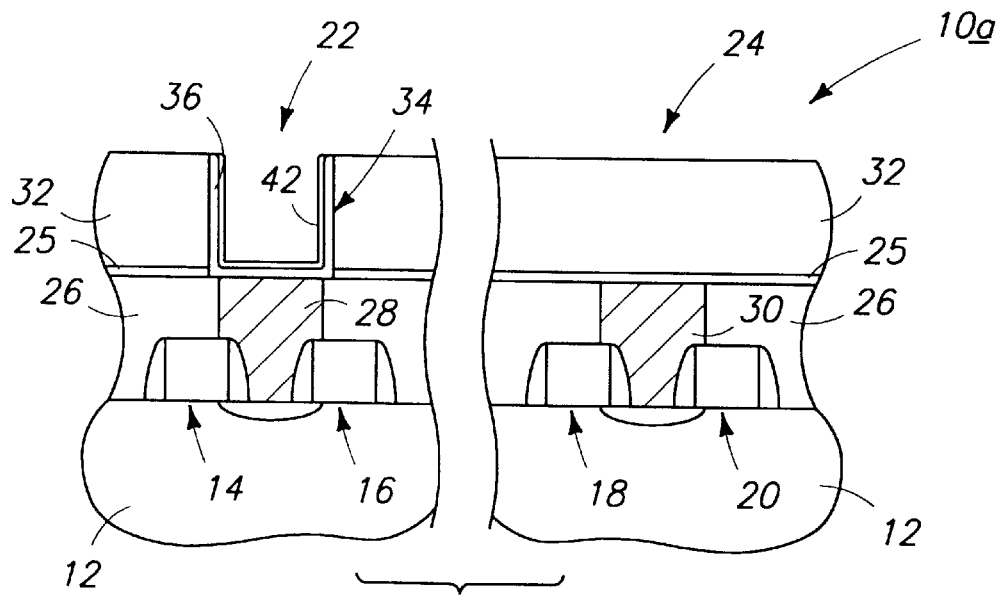
FIG. 5 is a view of the FIG. 3 wafer fragment at a processing step subsequent to that depicted by FIG. 4.

Referring to FIG. 5, a capacitor dielectric layer 42 (preferably comprising $Ta_2O_5$) is formed typically by chemical vapor deposition over the oxidation barrier layer and inner capacitor electrode 36. Such layer is thereafter exposed to densification conditions comprising a temperature of at least 750° C., while leaving insulative material of the doped oxide insulative layer 32 and insulative material of barrier layer 25 over second doped plug 30. Out diffusion of dopant material from second doped plug 30 is again restricted from occurring into doped insulative oxide layer 32 by insulative barrier layer 25 during such densification, with an intent being to completely eliminate any void formation as in the prior art FIG. 2 depiction.

Figure 6:
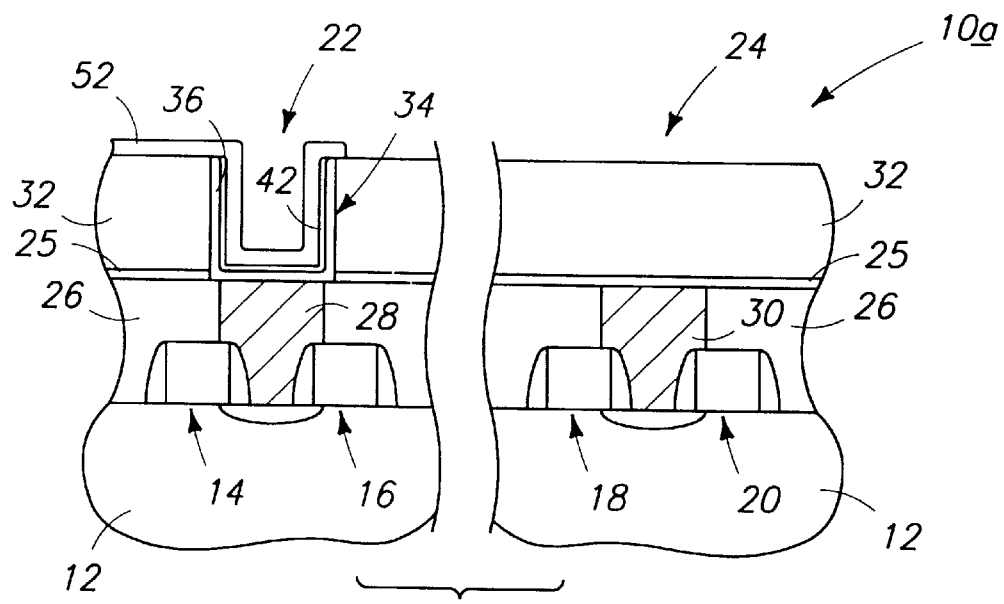
FIG. 6 is a view of the FIG. 3 wafer fragment at a processing step subsequent to that depicted by FIG. 5.

Referring to FIG. 6, a cell plate layer 52 (i.e., polysilicon or a combination of TiN and polysilicon) is deposited over $Ta_2O_5$ layer 42, and patterned as shown to form an outer capacitor plate. Such provides but one example of forming a capacitor having a capacitor 24 dielectric layer comprising $Ta_2O_5$ over and in electrical connection with first plug 28.

Figure 7:
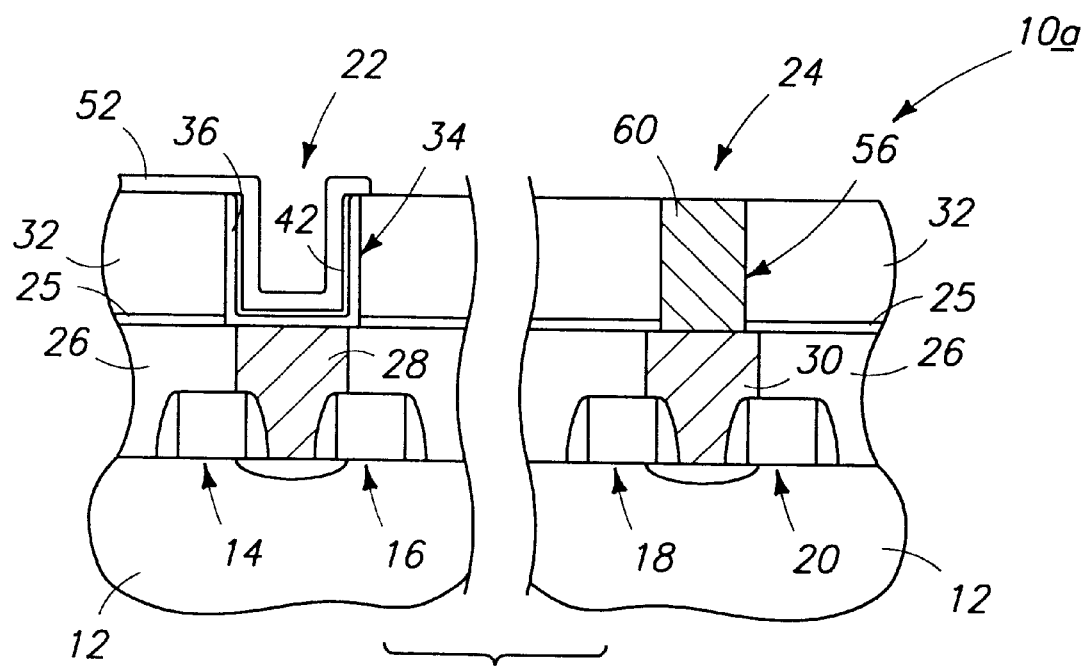
FIG. 7 is a view of the FIG. 3 wafer fragment at a processing step subsequent to that depicted by FIG. 6.

Referring to FIG. 7, an opening 56 is formed within and through insulative layer 32 and through layer 25 over conductive plug 30. Conductive material 60 (i.e., conductively doped polysilicon, tungsten, aluminum, or some other material) is deposited or otherwise formed within opening 56 through doped oxide insulative layer 32 and into electrical connection with doped plug 30.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:

forming spaced first and second conductively doped plugs of semiconductive material within a first insulative layer;

forming, over the first and second doped plugs, an insulative barrier layer to out diffusion of dopant material from the semiconductive material;

forming a doped oxide insulative layer over the insulative barrier layer and the first and second doped plugs;

forming an opening within the doped oxide insulative layer and insulative barrier layer over the first doped plug;

forming an inner capacitor electrode within the opening over and in electrical connection with the first doped plug while leaving insulative material of the doped oxide insulative layer and insulative material of the barrier layer over the second doped plug;

at a temperature of at least 900° C., nitridizing an outer surface of the inner capacitor electrode to form a silicon nitride layer over said outer surface while leaving insulative material of the doped oxide insulative layer and insulative material of the barrier layer over the second doped plug, and restricting out diffusion of dopant material from the second doped plug into the doped insulative oxide layer with the insulative barrier layer during said nitridizing;

depositing a $Ta_2O_5$ comprising capacitor dielectric layer over the silicon nitride;

exposing the deposited $Ta_2O_5$ layer to densification conditions comprising a temperature of at least 750° C. while leaving insulative material of the doped oxide insulative layer and insulative material of the barrier layer over the second doped plug, and restricting out diffusion of dopant material from the second doped plug into the doped insulative oxide layer with the insulative barrier layer during said densification;

forming an outer capacitor electrode over the $Ta_2O_5$ comprising capacitor dielectric layer; and after forming the outer capacitor electrode, forming conductive material through the doped oxide insulative layer and into electrical connection with the second doped plug.

2. The method of claim 1 wherein the conductively doped plugs are phosphorus doped, the doped oxide is phosphorus doped, and the insulative barrier layer comprises undoped oxide.

3. The method of claim 1 wherein the conductively doped plugs are phosphorus doped, the doped oxide is phosphorus doped, and the insulative barrier layer comprises $Si_3N_4$.

* * * * *

UNITED STATES PATENT AND TRADEMARK OFFICE
CERTIFICATE OF CORRECTION

PATENT NO.    : 6,165,833
DATED         : December 26, 2000
INVENTOR(S)   : Kunal R. Parekh and Randhir P.S. Thakur It is certified that error appears in the above-identified patent and that said Letters Patent is hereby corrected as shown below:

Column 2,
Line 14, delete "1" after the word -- with --

Column 5,
Line 21, delete "24" after the word -- capacitor --

Signed and Sealed this

Twenty-first Day of January, 2003

JAMES E. ROGAN
*Director of the United States Patent and Trademark Office*